(12) United States Patent
Srinivasaiah et al.

(10) Patent No.: US 6,813,737 B1
(45) Date of Patent: Nov. 2, 2004

(54) SHORT CIRCUITED CAPACITOR DETECTION IN AC COUPLED LINKS USING BOUNDARY SCAN TEST METHODOLOGY

(75) Inventors: Chandrasekhar Thyamagondlu Srinivasaiah, San Jose, CA (US); Udupi Harisharan, Cupertino, CA (US)

(73) Assignee: Cisco Technology, Inc., San Jose, CA (US)

( * ) Notice: Subject to any disclaimer, the term of this patent is extended or adjusted under 35 U.S.C. 154(b) by 508 days.

(21) Appl. No.: 09/999,649

(22) Filed: Oct. 31, 2001

(51) Int. Cl.[7] .............................................. G01R 31/28
(52) U.S. Cl. ...................................... 714/726; 714/738
(58) Field of Search ................................ 714/727, 726, 714/112, 738; 324/619; 702/118, 117; 341/100

(56) References Cited

U.S. PATENT DOCUMENTS

| | | | | |
|---|---|---|---|---|
| 5,444,715 A | * | 8/1995 | Gruetzner et al. ........... | 714/727 |
| 6,286,119 B1 | * | 9/2001 | Wu et al. .................... | 714/726 |
| 6,518,774 B2 | * | 2/2003 | Moore ......................... | 324/619 |
| 6,622,108 B1 | * | 9/2003 | De Jong et al. ............. | 702/118 |
| 6,653,957 B1 | * | 11/2003 | Patterson et al. ............ | 341/100 |
| 6,662,134 B2 | * | 12/2003 | Moore ......................... | 702/117 |
| 6,684,350 B1 | * | 1/2004 | Theodoras et al. .......... | 714/712 |

* cited by examiner

Primary Examiner—David Ton
(74) Attorney, Agent, or Firm—Thelen Reid & Priest LLP; Thierry K. Lo

(57) ABSTRACT

A boundary scan cell of a driving integrated circuit transmits an AC signal to a boundary scan cell of a receiving integrated circuit. Both integrated circuits are AC coupled by a capacitor. The transmitted AC signal has a frequency lower than a cut-off frequency of the capacitor. A comparator coupled to the AC signal at the driving IC and the signal at the receiving IC compares both signals and determines whether the capacitor is short-circuited.

13 Claims, 5 Drawing Sheets

US 6,813,737 B1

SHORT CIRCUITED CAPACITOR DETECTION IN AC COUPLED LINKS USING BOUNDARY SCAN TEST METHODOLOGY

FIELD OF THE INVENTION

The present invention relates to boundary scan testing of interconnections between integrated circuits. More particularly, the present invention relates to AC coupled boundary scan testing.

BACKGROUND OF THE INVENTION

Electronic systems generally include at least one printed circuit board (PCB) containing one or more integrated circuits (ICs). ICs typically include input/output (I/O) pins which may be coupled to various interconnects of the PCB. Testing performance of electronic systems which include PCBs and ICs typically requires testing at multiple levels including the chip level, the board level, and the system level. Testing at the board level includes testing interconnects of the PCB. Testing at the system level requires analysis of interconnections between and among the ICs, the PCBs, and other devices both on and off the PCB.

To enhance testability at the board level as well as at the system level, a common design practice at the chip level is to incorporate boundary scan test logic into an IC in accordance with Institute of Electrical and Electronics Engineers (IEEE) Standard 1149.1, Standard Test Access Port and Boundary-Scan Architecture. IEEE Standard 1149.1 specifies the function of JTAG logic, which is named for the Joint Test Action Group, for control of boundary scan testing. The two basic elements of an IC are its core logic and its I/O pins. In accordance with IEEE Standard 1149.1, boundary scan cells (BSCs) are inserted between the core logic and the I/O pins of the IC. BSCs are typically inserted for all I/O pins of the plurality of ICs on the PCB and may be used to test the integrity of the interconnections between the plurality of ICs.

Each IC may be controlled by boundary scan logic, in accordance with IEEE Standard 1149.1, to operate either in a system mode or in a JTAG test mode. In the system mode, system data signals relating to core functions of the IC are passed through the I/O pins to and from devices external to the IC. In the JTAG test mode, test data are provided by a boundary scan chain for the purpose of testing interconnections between the IC and devices external to the IC. A boundary scan chain is formed when the ICs are connected in a serial daisy chain. The boundary scan logic also provides conventional test control signals which include mode signals, shift signals, clock signals, and update signals, among others. The shift control signal instructions include a bypass instruction, a sample instruction, and a cross test instruction. The cross test instruction controls BSCs to perform a boundary scan test among the various ICs.

The IC further includes a test data input (TDI) demultiplexer, a test data output (TDO) multiplexer, a bypass register, an instruction register, an identification register, and a test access port (TAP) controller. The TDI demultiplexer includes an input coupled to receive a test data signal from the boundary scan logic which is typically external to the IC. The TDI demultiplexer includes a first output coupled to a TDI input of a first BSC of the plurality of BSCs in the IC. Each of the BSCs includes a TDI input and a TDO output. Each of BSCs is connected serially from a TDO output to a TDI input to propagate test data signals from one BSC to the next BSC in the chain. The TDI demultiplexer further includes a second output coupled to an input of the core logic, a third output coupled to an input of the bypass register; a fourth output coupled to an input of the instruction register; and a fifth output coupled to an input of the identification register.

The TDO multiplexer includes an output which is coupled to provide a test data signal to another IC or to the boundary scan logic. The TDO multiplexer further includes: a first input coupled to a TDO output of a last BSC of the plurality of BSCs in the IC, a second input coupled to an output of the core logic; a third input coupled to an output of the bypass register; a fourth input coupled to an output of the instruction register, and a fifth input coupled to an output of the identification register. The identification register includes inputs coupled to outputs of the TAP controller. The TAP controller includes inputs coupled to receive a Test Mode Select (TMS) signal, a Test Clock (TCK) signal, and a Test Reset (TRST) signal from the boundary scan logic.

In general, there are three possible I/O structures for an IC. These are a two-state I/O structure, a three-state I/O structure, and a bi-directional I/O structure. Each of the three I/O structures provides coupling between the core logic and at least one I/O pin. Any or all of the I/O structures may be used in an IC depending on the particular circumstances. The two-state I/O structure includes a two-state output buffer having a data input and a data output. The input of the two-state output buffer is coupled to a system data output of the core logic. The output of the two-state output buffer is coupled to an I/O pin. The three-state I/O structure includes a three-state output buffer having a data input, a data output, and a control input. The data input of the three-state output buffer is coupled to a system data output of the core logic. The data output of the three-state output buffer is coupled to an I/O pin. The control input of the three-state output buffer is coupled to a three-state system control signal output line of the core logic. The bi-directional I/O structure includes a bi-directional buffer. The bidirectional buffer includes an output buffer element having a data input a data output, and a control input and an in put buffer element having a data input and a data output. The control input of the output buffer element is coupled to a bidirectional control signal output line of the core logic. The data input of the output buffer element is coupled to a system data output of the core logic. The data output of the input buffer element is coupled to a system data received input of the core logic. The data output of the output buffer element and the data input of the input buffer element are coupled together at an I/O pin.

According to conventional methods and apparatus for boundary scan testing, the BSCs are inserted into the I/O structures between the buffers and the core logic. For a two-state output structure, a BSC is inserted between the core logic and the data input of the two-state output buffer. For a three-state output structure, a BSC is inserted between the system data output of the core logic and the data input of the three-state output buffer. Also, a BSC is inserted between the three-state control signal output line of the core logic and the control input of the three-state output buffer. For a bi-directional output structure, a BSC is inserted between the system control signal output line of the core logic and the bi-directional output buffer. Also, a bi-directional BSC is inserted between the core logic and the bi-directional output buffer.

Turning first to FIG. 1, a detailed logic block diagram of a prior art BSC 100 is shown. The BSC 100 includes a boundary scan mode multiplexer (mode multiplexer) 112, a shift multiplexer 114, a data shift/capture register 116, and an update data register 118. The mode multiplexer 112 and the shift multiplexer 114 each have a system input (0), an update input (1), an output 120, 122, and a select line 124, 126. The data shift/capture register 116 and the update data register 118 each have a data input (D), a clock input (CLK), a normal output (Q), and an inverted output (Q bar).

The BSC 100 includes a system data input. (SDI) line 128 for receiving system signals including system data signals and system control signals from the system signal output lines, including the system data signal output lines and the system control signal output lines, of the core logic (not shown). If the BSC 100 is used for control purposes, the SDI line 128 may receive a system control signal from the core logic. If the BSC 100 is used for output, the SDI line 128 may receive a system data signal from the core logic. If the BSC 100 is used for an input, the SDI line 128 becomes a system data received input (SDRI) line for receiving signals from the I/O pin through an input buffer. The BSC 1.00 also includes a system data output (SDO) line 130 for transmitting signals through an output buffer to the I/O pin. If the BSC 100 is used for an input, the SDO line 130 becomes a system data received output (SDRO) line for transmitting signals to the core logic. The SDI line 128 and the SDO line 136 complete the circuit between the core logic and the I/O structure that was bisected by the insertion of the BSC.

For control of the mode of operation by the boundary scan logic and for various test inputs from the boundary scan logic, the BSC 100 further includes a number of JTAG lines. Part or all of these lines taken collectively are sometimes referred to as a JTAG bus. The primary JTAG lines are a TDI line 132 which may receive a TDI signal from the boundary scan logic (not shown) either directly or via another BSC (not shown) and a TDO line 134 for providing a TDO signal to the boundary scan logic either directly or via another BSC. These two lines 132, 134 are common to all types of BSCs as they are used to form the chain of BSCs. The JTAG lines further include a ShiftDR signal input line 136, a ClockDR signal input line 138, an UpdateDR signal input line 140, and a Mode signal input line 142. Each of these lines is coupled to receive the corresponding signal from the boundary scan logic. The various lines and circuit elements are coupled to one another as shown in FIG. 1.

Turning now to FIG. 2, a detailed logic block diagram of a prior art bidirectional BSC 200 is shown. The bi-directional BSC 200 includes a bi-directional system multiplexer 222, a direction control multiplexer 224, a bidirectional shift control multiplexer 226, a bidirectional data shift/capture register 228, and a bidirectional update data register 230. The bi-directional system multiplexer 222, the direction control multiplexer 224, and the bi-directional shift control multiplexer 226 each have a system input (0), an update input (1), an output 232, 234, 236, and a select line 238, 240, 242. The bi-directional data shift/capture register 228 and the bi-directional update data register 230 each have a data input (D), a clock input (CLK), a normal output (Q), and an inverted output (Q bar).

Since the bi-directional BSC 200 serves both as an output and an input, it includes an SDI line 246, an SDO line 248, an SDRI line 250, and an SDRO line 250 as described above. Similarly, the bi-directional BSC 200 includes a TDI line 252, a TDO line 254, a ShiftDR signal input line 256, a ClockDR signal input line 258, an UpdateDR signal input line 260, and a Mode signal input line 262. In addition, the bi-directional BSC 200 includes a DIRCTL signal input line 264. Each of these lines is coupled to receive the corresponding signal from the boundary scan logic. The various lines and circuit elements are coupled to one another as shown in FIG. 2.

IEEE Standard 1149.1 was originally adopted in 1990. IEEE Standard 1149.1 does not attempt to address all situations and design practices. One such practice is the inclusion of capacitive coupling in the interconnections between ICs. In such situations, a capacitor is added either to the connection between the ICs or to one, the other, or both of the I/O pins of the ICs or the PCBs with connectors. The capacitor is usually intended to reduce noise and block unwanted common mode voltage differences in the interconnection. For discussion, this will be referred to alternatively as either being AC coupled or DC de-coupled.

Turning now to FIG. 3, a block diagram of ten possible DC and AC coupled interconnections between two devices is shown. The choice of which of the interconnections shown that are actually used in a particular circuit depends on the circumstances. Because of the capacitor used in the AC coupled interconnections, the value of a signal at the receiving end of the corresponding interconnection is no longer the same as the value at the driving end. The result is that conventional IEEE Standard 1149.1 testing becomes impractical on AC coupled interconnections. One will note that there are seven possible AC coupled combinations where IEEE Standard 1149.1 will not work as compared to only three DC coupled combinations where IEEE Standard 1149.1 will work. As the quest for higher signal speeds continues in the future, the use of AC coupling will increase. The consequence will be less and less reliance on conventional IEEE Standard 1149.1 testing. In addition, a short-circuited capacitor in AC coupled links will result in inaccurate testing using Boundary Scan Methodology.

A definite need exists for a boundary scan testing mechanism for AC coupled interconnections that builds on the advantages of conventional IEEE standard 11 49.1 testing. Specifically, a need exists for a boundary scan testing mechanism that is capable of detecting short-circuited capacitors in AC coupled interconnections. Ideally, such a detection mechanism would be simple and inexpensive. A primary purpose of the present invention is to solve these needs and provide further, related advantages.

BRIEF DESCRIPTION OF THE INVENTION

A boundary scan cell of a driving integrated circuit transmits an AC signal to a boundary scan cell of a receiving integrated circuit. Both integrated circuits are AC coupled by a capacitor. The transmitted AC signal has a frequency lower than a cut-off frequency of the capacitor. A comparator coupled to the AC signal at the driving IC and the signal at the receiving IC compares both signals and determines whether the capacitor is short-circuited.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of a method and apparatus for detecting a short-circuited capacitor in an alternating-current (AC) coupled interconnect of a circuit. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
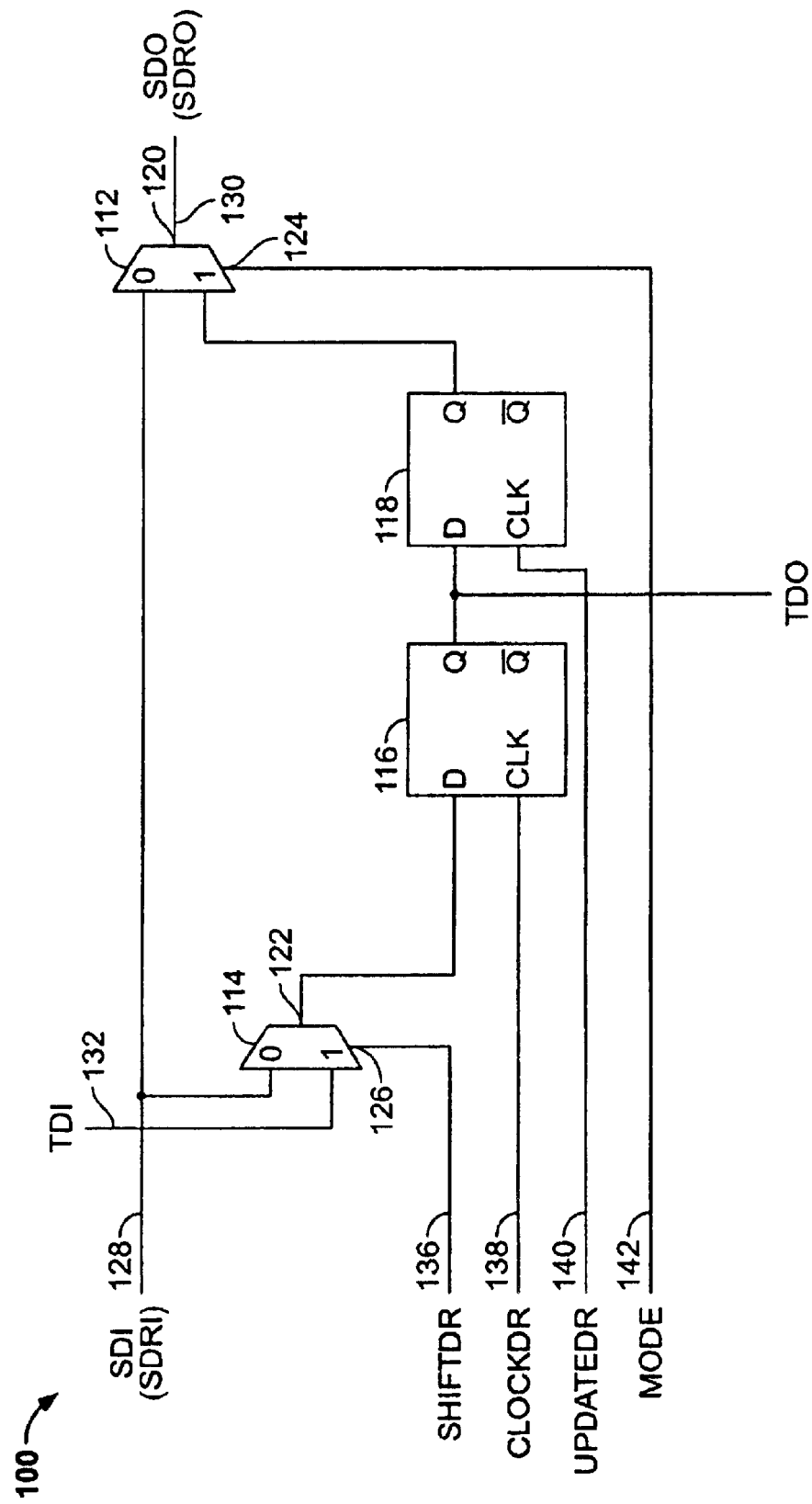
FIG. 1 is a logic block diagram of a prior art Boundary Scan Cell (BSC)
Figure 2:
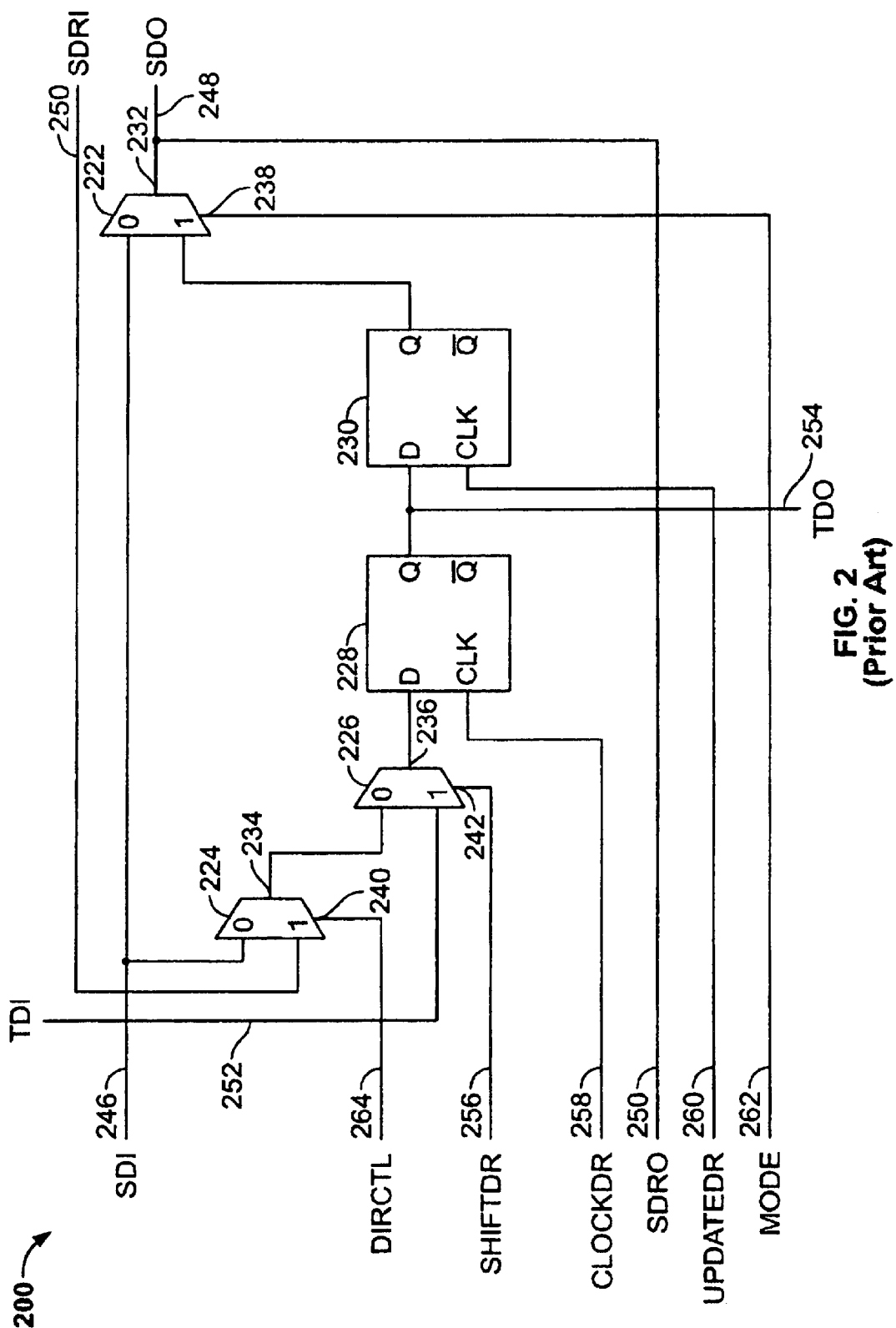
FIG. 2 is a logic block diagram of a prior art bi-directional BSC.
Figure 3:
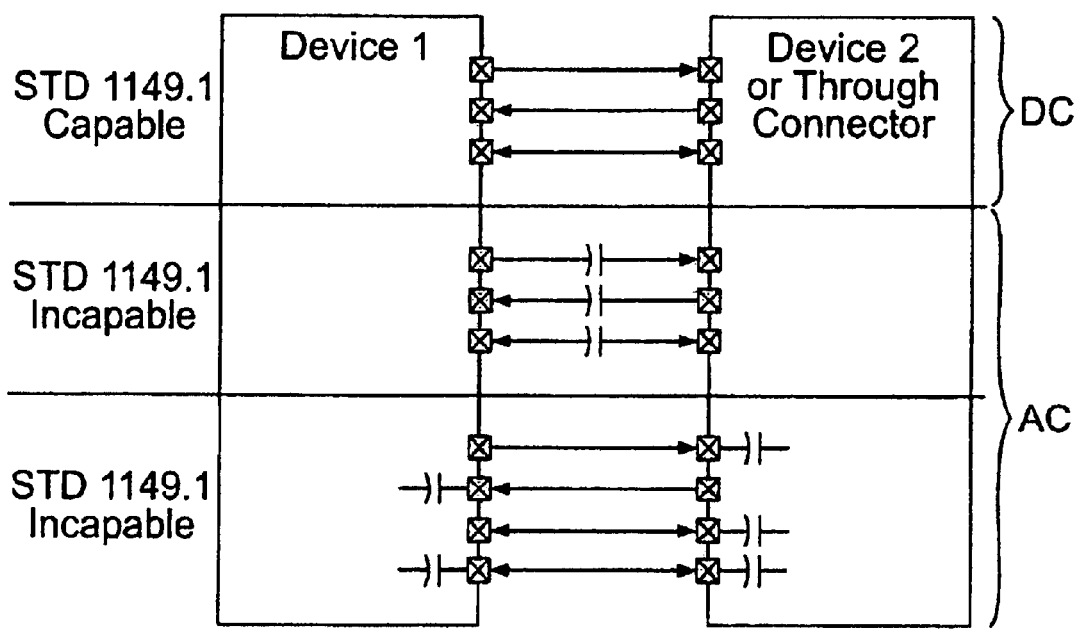
FIG. 3 is a block diagram of ten possible combinations of DC and AC coupled interconnections between two devices.
Figure 4:
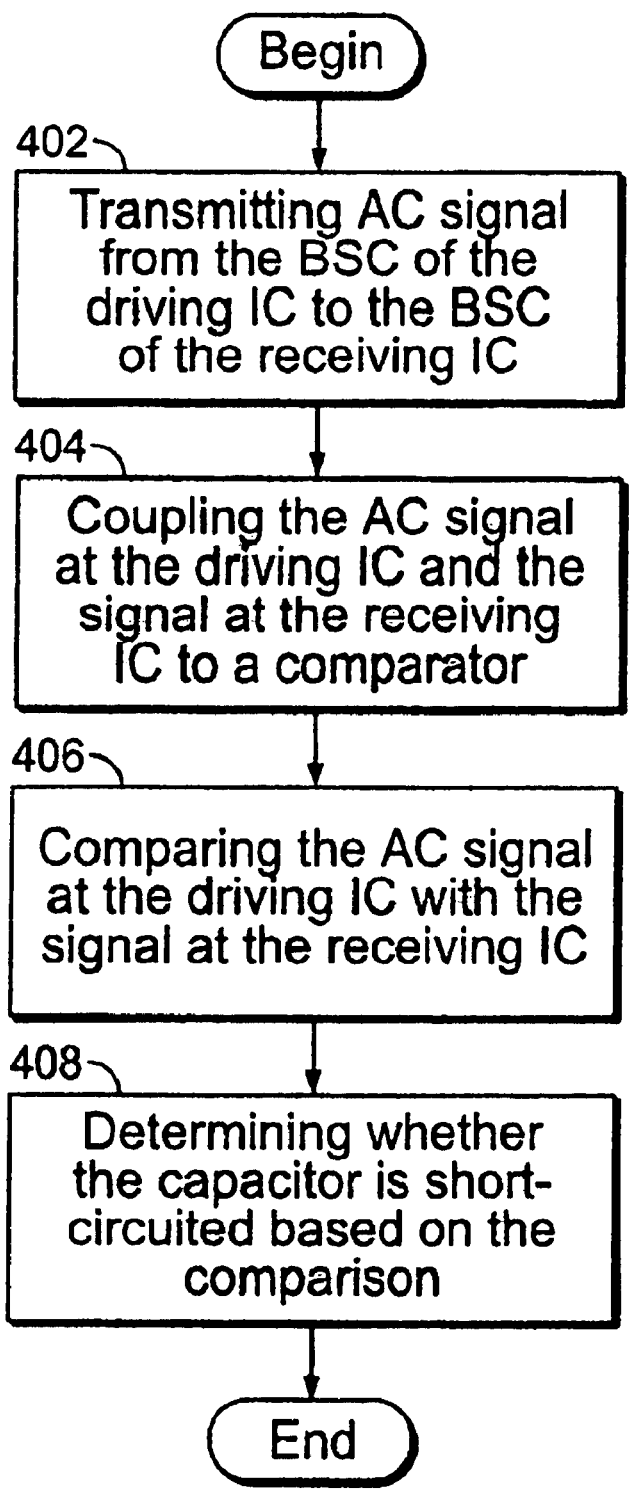
FIG. 4 is a flow diagram of a method for detecting short-circuited capacitors using boundary scan methodology according to a specific embodiment of the present invention.

FIG. 4 is a flow diagram of a method for detecting short-circuited capacitors using boundary scan methodology. In the interest of clarity, it will be assumed that the method is being performed on a circuit only having one driving Integrated Circuit (IC) and one receiving IC that are coupled together by at least one AC interconnection (i.e. a capacitor.). The principles disclosed below can now easily be extrapolated to larger circuits by those of ordinary skill in the art. In a first block 402, a test signal is transmitted from the driving IC to the receiving IC. More specifically, an AC test stimulus is applied to the Boundary Scan Cell (BSC) of the driving IC. The AC test stimulus may comprise a test pattern that is shifted into the BSC of the driving IC. The BSC of the driving IC is then updated. The results are then captured by the BSC of the receiving IC.

The test signal has a frequency lower than the cut-off frequency of the capacitor between the driving IC and the receiving IC. In a conventional AC coupled interconnect of a circuit having at least one driving IC and at least one receiving IC, the capacitor may typically have a range of operation from about 150 MHz to about 3 GHz. The test signals transmitted from a traditional BSC cannot propagate through the AC coupled interconnect at the frequency the BSC operates (usually in a range from 1 Hz to 25 MHz). No test signal can therefore propagate through the capacitor because the frequency of the test signal is lower than the cut-off frequency of the capacitor.

A capacitor connected to an AC current displays a capacitive reactance (Xc) defined as follows:

$$Xc = 1/\omega C \quad \text{Equation 1}$$

where $\omega$ represents the angular frequency and C represents the capacitance. As $\omega$ goes to infinity, Xc goes to zero, and thus the capacitor acts like a short at high frequencies. As $\omega$ goes to zero, Xc goes to infinity, and thus the capacitor acts like an open circuit. Each capacitor has a cut-off frequency that depends on the capacitance of the capacitor. The relationship between the cut-off frequency and the capacitance is defined by Equation 1. Therefore a test signal having a frequency lower than the cut-off frequency of the capacitor will not pass through the capacitor. The test signal should have an attenuation of less than 3 dB when it passes through the capacitor.

The combination of a low frequency with a low capacitance yields an open circuit in the AC coupled interconnects. That is, values updated on the driving IC can never reach the receiving IC. The present invention attempts to utilize these properties to detect a short-circuited capacitor.

In block 404, both the AC signal at the driving IC and the signal at the receiving IC are connected to a comparator, for example, a software program that receives values sampled by the hardware and compares them. In block 406, the comparator compares the AC signal at the driving IC with the signal at the receiving IC and based on that comparison, a short-circuited capacitor may be detected in the AC coupled interconnection in block 408. Generally, a capacitor is determined to be short-circuited when the signal at the receiving IC is the same or nearly the same as the signal transmitted at the driving IC.

Figure 5A:
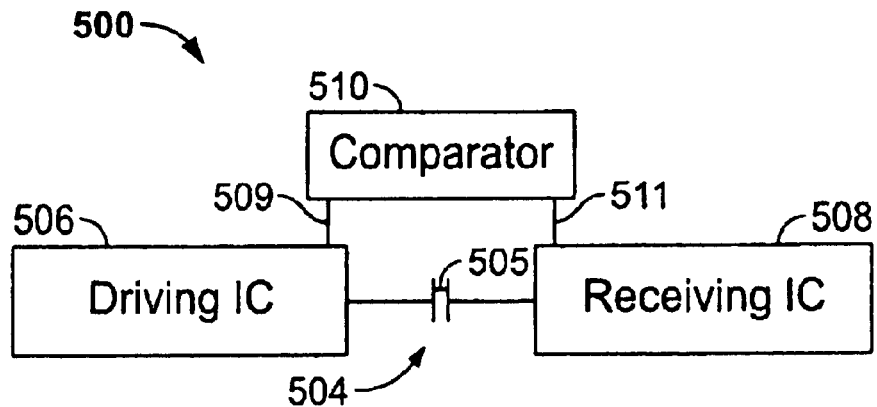
FIGS. 5A–5C are a block diagram of examples of DC and AC coupled interconnections between two devices according to a specific embodiment of the present invention.
Figure 5B:
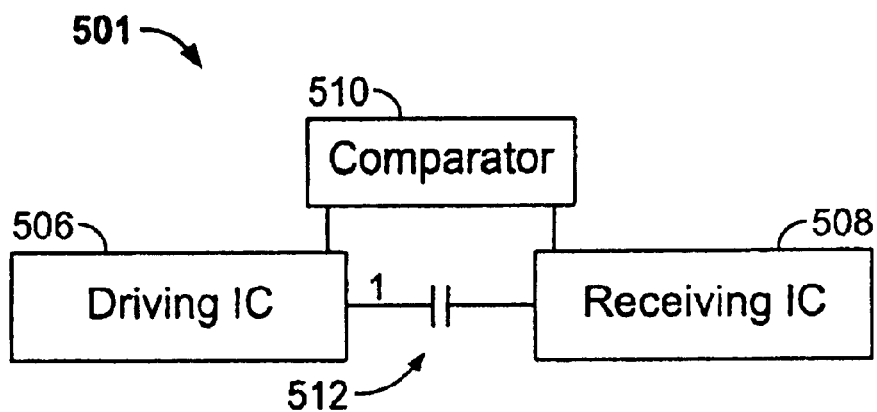
Figure 5C:
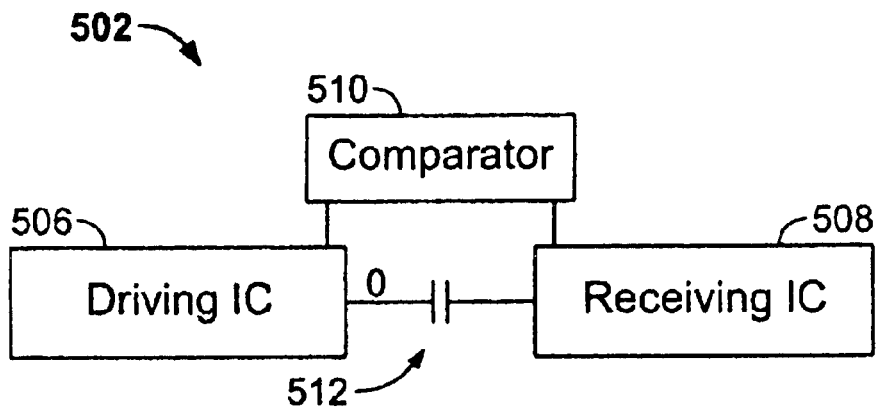

FIGS. 5A, 5B, and 5C illustrate examples of AC coupled interconnections between two devices. In a first AC coupled interconnection 500 in FIG. 5A, a capacitor 504 has a short 505 allowing a driving IC 506 to communicate with the receiving IC 508. A comparator 510 is connected to both the test signal at the driving IC 506 and the receiving IC 508. In a first block 402 of FIG. 4, signals are transmitted from the boundary scan cell (not shown) of the driving IC 506 to boundary scan cell (not shown) of the receiving IC 508 through the capacitor 504. Because the capacitor 504 is shorted, whatever signals are transmitted from the driving IC 506 reach the receiving IC 508 without substantial attenuation. That is, if the driving IC 506 transmits a signal representing "1", the receiving IC 508 will receive a signal representing "1". If the driving IC 506 transmits a signal representing "0", the receiving IC 508 will receive a signal representing "0". The comparator 510 determines whether the signals are the same at both connections 509 and 511. If they are substantially the same, the comparator 510 then determines that the capacitor 504 could be short-circuited.

In FIGS. 5B and 5C, a capacitor 512 connects both the driving IC 506 and the receiving IC 508. A comparator 510 is connected to both the test signal at the driving IC 506 and the receiving IC 508. In the block 402, signals are transmitted from the boundary scan cell (not shown) of the driving IC 506 to the boundary scan cell (not shown) of the receiving IC 508 through the capacitor 512. In AC coupled interconnection 501 illustrated in FIG. 5B, when the driving IC 506 transmits a signal representing "1", the receiving IC 508 receives a signal that is substantially different from a signal representing "1". That is, because the signal is transmitted at a frequency that is lower than the cut-off frequency of the capacitor 512, the capacitor 512 acts as an open circuit and attenuates the signal. In AC coupled interconnection 502 illustrated in FIG. 5C, when the driving IC 506 transmits a signal representing "0", the receiving IC 508 receives a signal that is substantially different from a signal representing "0". Indeed, the signal at the receiving IC 508 is the same in both the examples of FIG. 5B and FIG. 5C. Thus, regardless of whether a signal having a frequency less than the cut-off frequency of the capacitor 512 originates from the driving IC 506, that signal will not reach the receiving IC 508 because of the capacitor 512 acts as an open circuit. The signal measured by the comparator 510 at the receiving IC 508 does not depend on the signal produced by the driving IC 506.

The presently claimed invention assumes that a capacitor is present between the driving IC and the receiving IC. The presently claimed invention may also be useful after an AC test is run to guarantee that there are no stuck at fault on AC interconnections. Such a method is disclosed in a co-pending filed application entitled "Boundary scan cell for testing AC coupled interconnects using phase modulation technique" (Ser. No. 09/909,658 filed on Jul. 19, 2001 by inventors T Chandrasekhar, Udupi Harisharan, Chidambaram Ramaswany). A DC test boundary scan may also be run before applying the presently claimed invention; if the value of the signal at the receiving IC 508 is constant regardless of the value of the signal at the driving IC 506, the capacitor 512 is determined to be not shorted. Otherwise, if the signal at the driving IC 506 is substantially equal to the signal at the receiving IC 508, then the capacitor 504 is determined to be shorted.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for detecting a short-circuited capacitor in an alternating-current (AC) coupled interconnect of a circuit having a driving integrated circuit (IC) and a receiving IC that are coupled together by an AC interconnection, each IC having a plurality of boundary scan cells (BSCs), the method comprising:
   transmitting an AC signal from the BSC of the driving IC to the BSC of the receiving IC, said signal having a frequency lower than a cut-off frequency of the capacitor;
   coupling said AC signal at the driving IC and a signal at the receiving IC to a comparator; and
   comparing a phase of said AC signal at the driving IC with a phase of said signal at the receiving IC.

2. The method according to claim 1, further comprising determining that the capacitor is shorted if a phase of said AC signal at the driving IC and a phase of said signal at the receiving IC are substantially the same.

3. The method according to claim 1, further comprising determining that the capacitor is not shorted if a phase of said AC signal at said receiving IC stays the same regardless of a phase of said AC signal at the driving IC.

4. A method for detecting a short-circuited capacitor in an alternating-current (AC) coupled interconnect of a circuit having a driving integrated circuit (IC) and a receiving IC that are coupled together by an AC interconnection, each IC having a plurality of boundary scan cells (BSCs), the method comprising:
   shifting a test pattern into the BSCs of the driving IC;
   updating the BSCs of the driving IC;
   capturing the test pattern in the BSCs of the receiving IC;
   shifting the results out of the BSCs of the receiving IC; and
   comparing the test pattern from the driving IC with the test pattern at the receiving IC, the test pattern having a frequency lower than a cut-off frequency of the capacitor.

5. The method according to claim 4, further comprising determining that the capacitor is shorted if the test pattern at the driving IC and the test pattern at the receiving IC are substantially the same.

6. The method according to claim 4, further comprising determining that the capacitor is not shorted if the test pattern at the receiving IC stays the same regardless of the test pattern at the driving IC.

7. An apparatus for detecting a short-circuited capacitor in an AC coupled interconnect of a circuit having a driving IC and a receiving IC that are coupled together by an AC interconnection, each IC having a plurality of boundary scan cells (BSCs), the system comprising:
   means for transmitting an AC signal from the BSC of a driving IC to the BSC of a receiving IC, said signal having a frequency lower than a cut-off frequency of the capacitor;
   means for coupling said AC signal at the driving IC and a signal at said receiving IC to a comparator; and
   means for comparing a phase of said AC signal at the driving IC with a phase of said signal at the receiving IC.

8. The apparatus according to claim 7, further comprising means for determining that the capacitor is not shorted if a phase of said signal at the receiving IC stays the same regardless of a phase of said AC signal at the driving IC.

9. The apparatus according to claim 7, further comprising means for determining that the capacitor is shorted if said AC signal at the driving IC and said signal at said receiving IC are substantially the same.

10. A program storage device readable by a machine, tangibly embodying a program of instructions readable by the machine to perform a method for detecting a short-circuited capacitor in an alternating-current (AC) coupled interconnect of a circuit having a driving integrated circuit (IC) and a receiving IC that are coupled together by an AC interconnection, each IC having a plurality of boundary scan cells (BSCs), the method comprising:
   transmitting an AC signal from the BSC of a driving IC to the BSC of a receiving IC, said signal having a frequency lower than a cut-off frequency of the capacitor;
   coupling said AC signal at the driving IC and a signal at said receiving IC to a comparator; and
   comparing a phase of said AC signal at the driving IC with a phase of said signal at the receiving IC.

11. The method according to claim 10, further comprising determining that the capacitor is shorted if a phase of the AC signal at the driving IC and a phase of said signal at the receiving IC are substantially the same.

12. The method according to claim 10, further comprising determining that the capacitor is not shorted if a phase of the AC signal at the receiving IC stays the same regardless of a phase of the AC signal at the driving IC.

13. A system for testing AC coupled interconnects comprising:
   a driving IC;
   a receiving IC;
   a capacitor that couples said driving IC to said receiving IC;
   a comparator coupled to said driving IC and to said receiving IC;
   wherein said driving IC transmits an AC signal to said receiving IC, said AC signal having a frequency lower than the cut-off frequency of the capacitor; and
   a phase of said AC signal at said driving IC is compared with a phase of said AC signal at said receiving IC.

* * * * *

UNITED STATES PATENT AND TRADEMARK OFFICE
CERTIFICATE OF CORRECTION

PATENT NO. : 6,813,737 B1
DATED : November 2, 2004
INVENTOR(S) : Srinivasaiah

It is certified that error appears in the above-identified patent and that said Letters Patent is hereby corrected as shown below:

Column 2,
Line 38, after "a data input" insert -- , --
Line 39, replace "in put" with -- input --

Column 3,
Line 17, after "BSC" replace "1.00" with -- 100 --
Line 23, before "complete" replace "136" with -- 130 --

Column 4,
Line 33, replace "11 49.1" with -- 1149.1 --

Signed and Sealed this

Second Day of August, 2005

JON W. DUDAS
*Director of the United States Patent and Trademark Office*